(12) United States Patent
Kimura et al.

(10) Patent No.: US 7,341,894 B2
(45) Date of Patent: Mar. 11, 2008

(54) SEMICONDUCTOR, ELECTROOPTIC APPARATUS AND ELECTRONIC APPARATUS

(75) Inventors: Mitsumi Kimura, Kyotanabe (JP); Sumio Utsunomiya, Suwa (JP); Hiroyuki Hara, Chino (JP); Wakao Miyazawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/196,680

(22) Filed: Aug. 4, 2005

(65) Prior Publication Data
US 2005/0280037 A1 Dec. 22, 2005

Related U.S. Application Data

(63) Continuation of application No. 10/395,393, filed on Mar. 25, 2003, now abandoned.

(30) Foreign Application Priority Data

Mar. 29, 2002 (JP) ............................... 2002-097196

(51) Int. Cl.
*H01L 29/04* (2006.01)
(52) U.S. Cl. ....................... 438/149; 438/107; 438/612
(58) Field of Classification Search ..................... None
See application file for complete search history.

(56) References Cited

U.S. PATENT DOCUMENTS

| 5,339,180 A | * | 8/1994 | Katoh | 349/46 |
| 5,382,827 A | | 1/1995 | Wang et al. | 257/528 |
| 5,475,262 A | | 12/1995 | Wang et al. | |
| 5,757,456 A | | 5/1998 | Yamazaki et al. | |
| 5,920,464 A | | 7/1999 | Yokoyama et al. | 361/779 |
| 6,118,502 A | | 9/2000 | Yamazaki et al. | |

(Continued)

FOREIGN PATENT DOCUMENTS

JP A 6-163809 6/1994

(Continued)

OTHER PUBLICATIONS

Shimoda et al., "Surface Free Technology by Laser Amealing (SUFTLA)", IEDM, 1999, pp. 289-292.

(Continued)

*Primary Examiner*—Leonardo Andujar
(74) *Attorney, Agent, or Firm*—Oliff & Berridge, PLC

(57) ABSTRACT

In a semiconductor device made by forming functional elements on a first substrate, transferring the element chip onto a second substrate, and connecting first pads on the element chip to second pads on the second substrate, the area or the width of the first is increased. The first pads can be securely connected to the second pads even when misalignment occurs during the separating and transferring processes. Only the first pads are formed on a surface of the element chip at the second-substrate-side. The functional elements are formed to be farther from the second substrate than the first pads. Alternatively, only the first pads are formed on a surface of the element chip remote from the second substrate, and the functional elements are formed to be closer to the second substrate than the first pads. Alternatively, the first pads are formed on both the surface of the element chip at the second-substrate-side and the surface of the element chip remote from the second substrate.

16 Claims, 11 Drawing Sheets

U.S. PATENT DOCUMENTS

| | | | |
|---|---|---|---|
| 6,137,063 A | 10/2000 | Jiang | 174/261 |
| 6,137,184 A | 10/2000 | Ikegami | |
| 6,143,117 A | 11/2000 | Kelly et al. | |
| 6,355,504 B1 | 3/2002 | Jiang | |
| 6,365,842 B1 | 4/2002 | Jiang | 174/261 |
| 6,465,330 B1 * | 10/2002 | Takahashi et al. | 438/464 |
| 6,559,905 B1 | 5/2003 | Akiyama | 349/45 |
| 6,667,192 B1 * | 12/2003 | Patrice et al. | 438/123 |
| 6,943,047 B2 * | 9/2005 | Yanagisawa et al. | 438/22 |
| 7,050,138 B1 | 5/2006 | Yamazaki et al. | |
| 2003/0071953 A1 | 4/2003 | Yamazaki et al. | |
| 2005/0070038 A1 | 3/2005 | Yamazaki et al. | |

FOREIGN PATENT DOCUMENTS

| | | | |
|---|---|---|---|
| JP | A 08-250745 | | 9/1996 |
| JP | A 10-303252 | | 11/1998 |
| JP | 11-020360 | | 1/1999 |
| JP | A 11-017050 | | 1/1999 |
| JP | A 11-024106 | | 1/1999 |
| JP | 2000068237 A | * | 3/2000 |
| JP | 2001-007340 | | 1/2001 |
| JP | A 2001-168339 | | 6/2001 |
| JP | A 2001-282423 | | 10/2001 |
| JP | A 2001-282424 | | 10/2001 |
| WO | WO 00/77729 | * | 12/2000 |

OTHER PUBLICATIONS

Utsunomiya et al., "36.2: Low Temperature Poly-Si TFTs on Plastic Substrate Using Surface Free Technology by Laser Ablation/Annealing (SUFTLA™)", SID 00 DIGEST, 2000, pp. 916-919.

Shimoda et al., "Future Trend of TFTs", Asia Display/IDW '01, pp. 327-330.

Utsunomiya et al., "Low Temperature Poly-Si TFT-LCD Transferred onto Plastic Substrate Using Surface Free Technology by Laser Ablation/Annealing (SUFTLA)", Asia Display/IDW '01, pp. 339-342.

Shimoda et al., "26.3: Multicolor Pixel Patterning of Light-Emitting Polymers by Ink-Jet Printing", SID 99 DIGEST, 1999, pp. 376-379.

Kanabe et al., "Patterning of High Performance Poly(dialkylfluorene) derivatives for LightEmitting Full Color Display by Ink-Jet Printing", Proc. Euro Display 99, 1999, Late-News Papers pp. 85-88.

Wolf et al., Silicon Processing for the VLSI Era, 2000, vol. I, Lattice Press, 719-727, 791-795.

* cited by examiner (a)

(b)

(a)

(b)

(a)

(b)

(c)

US 7,341,894 B2

SEMICONDUCTOR, ELECTROOPTIC APPARATUS AND ELECTRONIC APPARATUS

This is a divisional of U.S. patent application Ser. No. 10/395,393, filed Mar. 25, 2003 now abandoned, which is incorporated herein in its entirety by reference.

BACKGROUND OF THE INVENTION

1. Field of Invention

The present invention relates to semiconductor devices. More specifically, the invention relates to a semiconductor device made by forming functional elements on a first substrate, separating an element chip including at least one functional element, transferring the element chip to a second substrate, and connecting first pads composed of a conductive material and disposed on the element chip to second pads composed of a conductive material and disposed on the second substrate. Moreover, the invention relates to a semiconductor device made by forming functional elements on a first substrate, separating an element chip including at least one functional element, transferring the element chip to a third substrate, transferring the element chip to a second substrate, and connecting first pads composed of a conductive material and disposed on the element chip to second pads composed of a conductive material and disposed on the second substrate.

2. Description of Related Art

In related art semiconductor devices, such as electronic circuits including functional elements, e.g., thin-film transistors or organic electroluminescent elements, interconnections between the functional elements, and supporting substrates, the functional elements can constitute only part of the whole, the rest being the interconnections and supporting substrates. When this type of semiconductor device is produced in one manufacturing process whereby the functional elements, the interconnections, and the supporting substrates are integrally formed, a highly advanced complicated manufacturing process is necessary to produce highly functional elements. This generally increases the manufacturing cost. However, no complicated manufacturing process is necessary to produce interconnections and supporting substrates, and the manufacturing cost thereof is low. The manufacturing cost of the semiconductor device as a whole can be averaged out and decreased if functional elements are manufactured in a process separate from that of manufacturing interconnections and supporting substrates, and subsequently installed at only required positions.

In view of the above, the related art also includes semiconductor devices that are made by forming functional elements on a first substrate, separating an element chip including at least one functional element, transferring the element chip to a second substrate, and connecting first pads composed of a conductive material and disposed on the element chip to second pads composed of a conductive material and disposed on the second substrate. The related art also includes semiconductor devices made by forming functional elements on a first substrate, separating an element chip including at least one functional element, transferring the element chip to a third substrate, transferring the element chip to a second substrate, and connecting first pads composed of a conductive material and disposed on the element chip to second pads composed of a conductive material and disposed on the second substrate. The related art also includes electrooptic apparatuses, such as a display apparatus that use these semiconductor devices. In this manner, the functional elements can be placed only at the required positions. When averaged out, the manufacturing cost of the semiconductor device as a whole can be reduced. In order to perform the separating and transferring processes, laser ablation or an adhesive agent can be used, as disclosed in (T. Shimoda, et al., Techn. Dig. IEDM 1999, 289; S. Utsunomiya, et al., Dig. Tech. Pap. SID 2000, 916; T. Shimoda, Proc. Asia Display/IDW '01, 327; and S. Utsunomiya, et al., Proc. Asia Display/IDW '01, 339).

SUMMARY OF THE INVENTION

In developing semiconductor devices made by forming functional elements on a first substrate, separating an element chip including at least one functional element, transferring the element chip to a second substrate, and connecting first pads composed of a conductive material and disposed on the element chip to second pads composed of a conductive material and disposed on the second substrate, and in developing semiconductor devices made by forming functional elements on a first substrate, separating an element chip including at least one functional element, transferring the element chip to a third substrate, transferring the element chip to a second substrate, and connecting first pads composed of a conductive material and disposed on the element chip to second pads composed of a conductive material and disposed on the second substrate, one of the challenging tasks is how to form the connection between the first pads and the second pads. Since misalignment can occur during the separation and transfer processes, the area of each first pad and each second pad is preferably large so that the connection between the first and second pads is secured, even when misalignment occurs. However, it is difficult to form large first pads on a small element chip, the size of which is reduced to decrease the manufacturing cost. On the other hand, it is relatively easy to form large second pads since the second substrate often has a real allowance. Preferably, the first pads are not only large but also wide.

The present invention increases the area and the width of the first pad of a semiconductor element made by forming functional elements on a first substrate, separating an element chip comprising at least one functional element, transferring the element chip to a second substrate, and connecting first pads composed of a conductive material and disposed on the element chip to second pads composed of a conductive material and disposed on the second substrate, or a semiconductor element made by forming functional elements on a first substrate, separating an element chip comprising at least one functional element, transferring the element chip to a third substrate, transferring the element chip to a second substrate, and connecting first pads composed of a conductive material and disposed on the element chip to second pads composed of a conductive material and disposed on the second substrate. According to this structure, the first pads can be reliably connected to the second pads even when misalignment occurs during the separation and transfer processes. Moreover, the contact resistance can be reduced by increasing the area of the first pads and the area of the corresponding second pads.

An aspect of the present invention provides a semiconductor device manufactured by forming functional elements on a first substrate, separating an element chip including at least one functional element, transferring the element chip to a second substrate, and connecting first pads composed of a conductive material and disposed on the element chip to second pads composed of a conductive material and disposed on the second substrate. Only the first pads are formed on a surface of the element chip at the second-substrate-side.

According to this structure, the area of each first pad can be increased.

In the semiconductor device of this aspect of the present invention, the functional elements are farther from the second substrate than the first pads.

According to this structure, the area of each first pad can be increased since the first pads and the functional elements are stacked on each other.

Another aspect of the present invention provides a semiconductor device manufactured by forming functional elements on a first substrate, separating an element chip including at least one functional element, transferring the element chip to a second substrate, and connecting first pads composed of a conductive material and disposed on the element chip to second pads composed of a conductive material and disposed on the second substrate. Only the first pads are formed on a surface of the element chip remote from the second substrate.

According to this structure, the area of each first pad can be increased.

In the semiconductor device of this aspect, the functional elements are formed to be closer to the second substrate than the first pads.

According to this structure, the area of each first pad can be increased since the first pads and the functional elements are stacked on each other.

Another aspect of the present invention provides a semiconductor device manufactured by forming functional elements on a first substrate, separating an element chip including at least one functional element, transferring the element chip to a second substrate, and connecting first pads composed of a conductive material and disposed on the element chip to second pads composed of a conductive material and disposed on the second substrate. The first pads are formed on both a surface of the element chip at the second-substrate-side and a surface of the element chip remote from the second substrate.

According to this structure the area of each first pad can be further increased.

Another aspect of the present invention provides a semiconductor device manufactured by forming functional elements on a first substrate, separating an element chip including at least one functional element, transferring the element chip to a second substrate, and connecting first pads composed of a conductive material and disposed on the element chip to second pads composed of a conductive material and disposed on the second substrate. The following expression is satisfied:

$$L > 2\pi^{1/2} S^{1/2}$$

where L is the peripheral length and S is the area of the element chip.

According to this structure, the peripheral length of the element chip can be increased to form wide first pads. Since the area of the element chip does not increase, the effect of manufacturing cost reduction remains the same.

The semiconductor device of this aspect may be provided such that $L > 4S^{1/2}$.

Also, according to this structure, the peripheral length of the element chip can be increased to form wide first pads. Since the area of the element chip does not increase, the effect of manufacturing cost reduction remains the same.

Another aspect (claim 8) of the present invention provides a semiconductor device manufactured by forming functional elements on a first substrate, separating an element chip including at least one functional element, transferring the element chip to a second substrate, and connecting first pads composed of a conductive material and disposed on the element chip to second pads composed of a conductive material and disposed on the second substrate. The first pads or the second pads are formed using a low-melting-point material such as solder, indium, or lead.

According to this structure, the first pads can be connected to the second pads by applying high temperatures for a predetermined time after the transfer of the separated element chip.

Another aspect of the present invention provides a semiconductor device manufactured by forming functional elements on a first substrate, separating an element chip including at least one functional element, transferring the element chip to a second substrate, and connecting first pads composed of a conductive material and disposed on the element chip to second pads composed of a conductive material and disposed on the second substrate. The first pads are formed to protrude from a side face of the element chip outwardly parallel the plane of the first substrate, and shapes corresponding to the first pads are formed in the second substrate.

According to this structure, the first pads and the second pads can be self-aligned, and the connection between the first pad and the second pad are ensured even when misalignment occurs.

Another aspect of the present invention provides a semiconductor device manufactured by forming functional elements on a first substrate, separating an element chip including at least one functional element, transferring the element chip to a second substrate, and connecting first pads composed of a conductive material and disposed on the element chip to second pads composed of a conductive material and disposed on the second substrate. The first pads have a convex shape and the second pads have a concave shape, or the first pads have a concave shape and the second pads have a convex shape.

Also, according to this structure, the first pads and the second pads can be self-aligned, and the connection between the first pad and the second pad are ensured even when misalignment occurs.

Another aspect of the present invention provides a semiconductor device manufactured by forming functional elements on a first substrate, separating an element chip including at least one functional element, transferring the element chip to a second substrate, and connecting first pads composed of a conductive material and disposed on the element chip to second pads composed of a conductive material and disposed on the second substrate. A low-dielectric-constant material is used in an insulating layer of the element chip.

According to this structure, the parasitic capacitance at and around the functional elements of the element chip can be decreased, and a decrease in the power consumption and an increase in the operating frequency can be expected.

Another aspect of the present invention provides a semiconductor device manufactured by forming functional elements on a first substrate, separating an element chip including at least one functional element, transferring the element chip to a second substrate, and connecting first pads composed of a conductive material and disposed on the element chip to second pads composed of a conductive material and disposed on the second substrate. Air, liquid, or vacuum is used in an insulating layer of the element chip.

According to this structure, the parasitic capacitance at and around the functional elements of the element chip can also be decreased, and a decrease in the power consumption and an increase in the operating frequency can be expected.

Another aspect of the present invention provides a semiconductor device manufactured by forming functional elements on a first substrate, separating an element chip including at least one functional element, transferring the element chip to a third substrate, transferring the element chip to a second substrate, and connecting first pads composed of a conductive material and disposed on the element chip to second pads composed of a conductive material and disposed on the second substrate. Only the first pads are formed on a surface of the element chip at the second-substrate-side.

According to this structure, the area of each first pad can be increased.

In the semiconductor device of this aspect the functional elements are farther from the second substrate than the first pads.

According to this structure, the area of each first pad can be increased since the first pads and the functional elements are stacked on each other.

Another aspect of the present invention provides a semiconductor device manufactured by forming functional elements on a first substrate, separating an element chip including at least one functional element, transferring the element chip to a third substrate, transferring the element chip to a second substrate, and connecting first pads composed of a conductive material and disposed on the element chip to second pads composed of a conductive material and disposed on the second substrate. Only the first pads are formed on a surface of the element chip remote from the second substrate.

According to this structure, the area of each first pad can be increased.

In the semiconductor device of this aspect the functional elements are formed to be closer to the second substrate than the first pads.

According to this structure, the area of each first pad can be increased since the functional elements and the first pads are stacked on each other.

According to this structure, the area of each first pad can be increased.

Another aspect of the present invention provides a semiconductor device manufactured by forming functional elements on a first substrate, separating an element chip including at least one functional element, transferring the element chip to a third substrate, transferring the element chip to a second substrate, and connecting first pads composed of a conductive material and disposed on the element chip to second pads composed of a conductive material and disposed on the second substrate. The first pads are formed on both a surface of the element chip at the second-substrate-side and a surface of the element chip remote from the second substrate.

According to this structure, the area of each first pad can be further increased.

Another aspect of the present invention provides a semiconductor device manufactured by forming functional elements on a first substrate, separating an element chip including at least one functional element, transferring the element chip to a third substrate, transferring the element chip to a second substrate, and connecting first pads composed of a conductive material and disposed on the element chip to second pads composed of a conductive material and disposed on the second substrate. The following expression is satisfied:

$$L > 2\pi^{1/2} S^{1/2}$$

where L is the peripheral length and S is the area of the element chip.

According to this structure, the peripheral length of the element chip can be increased to form wide first pads. Since the area of the element chip does not increase, the same advantages of reducing the manufacturing cost can be achieved.

In the semiconductor device of this aspect, the following expression is satisfied: $L > 4S^{1/2}$.

According to this structure also, the peripheral length of the element chip can be increased to form wide first pads. Since the area of the element chip does not increase, the same advantages of reducing the manufacturing cost can be achieved.

Another aspect of the present invention provides a semiconductor device manufactured by forming functional elements on a first substrate, separating an element chip including at least one functional element, transferring the element chip to a third substrate, transferring the element chip to a second substrate, and connecting first pads composed of a conductive material and disposed on the element chip to second pads composed of a conductive material and disposed on the second substrate. The first pads or the second pads are formed using a low-melting-point material, such as solder, indium, or lead.

According to this structure, the first pads can be connected to the second pads by applying high temperatures for a predetermined time after the transfer of the separated element chip.

Another aspect of the present invention provides a semiconductor device manufactured by forming functional elements on a first substrate, separating an element chip including at least one functional element, transferring the element chip to a third substrate, transferring the element chip to a second substrate, and connecting first pads composed of a conductive material and disposed on the element chip to second pads composed of a conductive material and disposed on the second substrate. The first pads are formed to protrude from a side face of the element chip outwardly parallel to the plane of the first substrate, and shapes corresponding to the first pads are formed in the second substrate.

According to this structure, the first pads and the second pads can be self-aligned, and the connection between the first pad and the second pad are ensured even when misalignment occurs.

Another aspect of the present invention provides a semiconductor device manufactured by forming functional elements on a first substrate, separating an element chip including at least one functional element, transferring the element chip to a third substrate, transferring the element chip to a second substrate, and connecting first pads composed of a conductive material and disposed on the element chip to second pads composed of a conductive material and disposed on the second substrate. The first pads have a convex shape and the second pads have a concave shape, or the first pads have a concave shape and the second pads have a convex shape.

According to this structure also, the first pads and the second pads can be self-aligned, and the connection between the first pad and the second pad are ensured even when misalignment occurs.

Another aspect of the present invention provides a semiconductor device manufactured by forming functional elements on a first substrate, separating an element chip including at least one functional element, transferring the element chip to a third substrate, transferring the element chip to a second substrate, and connecting first pads composed of a conductive material and disposed on the element chip to second pads composed of a conductive material and disposed on the second substrate. A low-dielectric-constant material is used in an insulating layer of the element chip.

According to this structure, the parasitic capacitance at and around the functional elements of the element chip can be decreased, and a decrease in the power consumption and an increase in the operating frequency can be expected.

Another aspect of the present invention provides a semiconductor device manufactured by forming functional elements on a first substrate, separating an element chip including at least one functional element, transferring the element chip to a third substrate, transferring the element chip to a second substrate, and connecting first pads composed of a conductive material and disposed on the element chip to second pads composed of a conductive material and disposed on the second substrate. Air, liquid, or vacuum is used in an insulating layer of the element chip.

According to this structure also, the parasitic capacitance at and around the functional elements of the element chip can be decreased, and a decrease in the power consumption and an increase in the operating frequency can be expected.

In the semiconductor device of the above-described aspects, the separating and transferring of the element chip are performed using laser radiation.

In this manner, the separation and the transfer of the element chip can be performed with stability.

In the semiconductor device of the above-described aspects, the functional elements are thin-film transistors.

According to this structure, the area and the width of each first pad can be increased even in high-performance transistors that have conventionally required advanced, complicated manufacturing processes.

In the semiconductor device of the above-described aspects, the functional elements are organic electroluminescent elements.

According to this structure, the area and the width of each first pad can be increased even in high-performance organic electroluminescent element that have, in the related art, required advanced, complicated manufacturing processes.

Another aspect of the present invention provides an electrooptic apparatus including a semiconductor device according to the above-described aspects.

According to this structure, since electrooptic apparatuses generally have a large a real ratio of the interconnections and the substrate to the functional element, the cost-reducing effect is particularly acute. The interconnections and the supporting substrates can be prepared separately from the functional elements, and the functional elements are then installed only at the required positions.

Another aspect of the present invention provides an electronic apparatus including a semiconductor device according to the above-described aspects.

According to this structure, the fist pads can be reliably connected to the second pad while reducing the manufacturing cost, and high-performance electronic apparatuses may be obtained.

DETAILED DESCRIPTION OF PREFERRED EMBODIMENTS

Exemplary embodiments of the present invention are described below.

First Exemplary Embodiment

Figure 1:
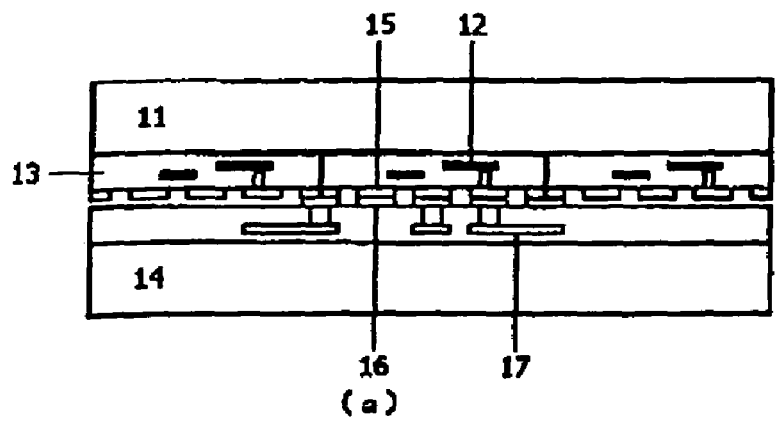
FIGS. 1(*a*) and 1(*b*) are schematics that show a manufacturing method according to a first exemplary embodiment of the present invention.

FIGS. 1(*a*) and 1(*b*) show manufacturing steps according to a first exemplary embodiment of the present invention. A semiconductor device, such as an electronic circuit or the like, is manufactured by forming functional elements 12 on a first substrate 11, separating an element chip 13 including at least one functional element 12, transferring the element chip 13 onto a second substrate 14, and connecting first pads 15 composed of a conductive material and disposed on the element chip 13 to second pads 16 composed of a conductive material and disposed on the second substrate 14. FIG. 1(*a*) is a schematic showing the step of bonding an element-chipforming face of the first substrate 11 onto the second substrate 14. FIG. 1(b) is a schematic showing the step of separating the element chip 13 from the first substrate 11, transferring the element chip 13 onto the second substrate 14, and removing the first substrate 11. The connection between the first pads 15 and the second pads 16 may be made either before or after the separating and transferring.

Figure 2:
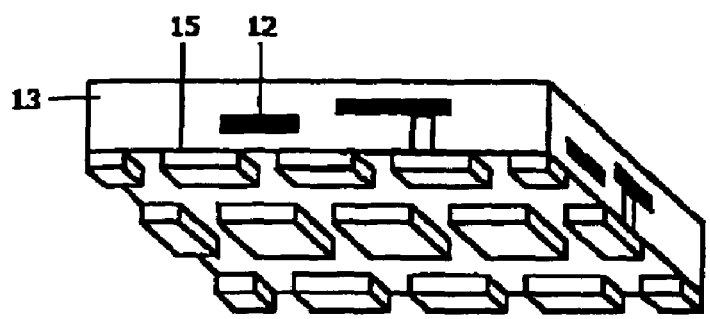
FIG. 2 is a schematic perspective view that shows the structure of an element chip according to the first exemplary embodiment of the present invention.

FIG. 2 is a schematic showing the structure of the element chip according to the first exemplary embodiment of the present invention. The functional elements 12 are electrically connected to predetermined first pads 15. Only the first pads 15 are formed on the surface of the element chip 13 at the second-substrate-14-side. No other element or electrodes are formed on the surface of the element chip 13 at the second-substrate-14-side. According to this structure, the area of the first pads 15 can be increased. The functional elements 12 are farther from the second substrate 14 than the first pads 15. According to this structure, the functional elements 12 and the first pads 15 are formed by stacking, the functional elements 12 being positioned farther from the second substrate 14 than the first pads 15, and the area of the first pads 15 stacked on the functional elements 12 can be increased.

Figure 3:
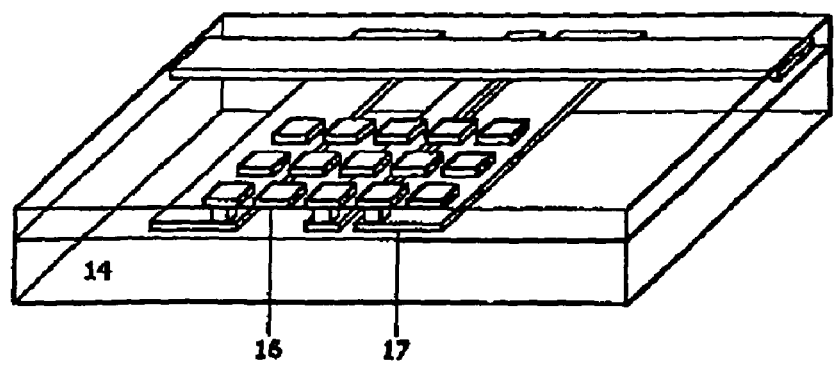
FIG. 3 is a schematic perspective view that shows the structure of a second substrate according to the first exemplary embodiment of the present invention.

FIG. 3 is a schematic showing the structure of the second substrate according to the first exemplary embodiment of the present invention. The schematic is a perspective view, and interconnections, contact holes, via plugs, and the like are partially omitted from FIG. 3. Not only the second pads 16 but also interconnections 17 for connection with the predetermined second pads 16 are formed on the second substrate 14. The second pads 16 are formed on the second substrate 14 at the positions corresponding to the positions of the first pads 15 on the element chip 13.

A semiconductor device may also be formed by forming the functional elements 12 on the first substrate 11, separating the element chip 13 including at least one functional element 12, transferring the element chip 13 on a third substrate 18, transferring the element chip 13 on the second substrate 14, and connecting the first pads 15 composed of a conductive material and disposed on the element chip 13 to the second pads 16 composed of a conductive material and disposed on the second substrate 14. Also, in this device, it is particularly effective to form only the first pads 15 on the surface of the element chip 13 at the-second-substrate-14-side in order to increase the area of the first pads 15. At this time, by forming the functional elements 12 at positions farther from the second substrate 14 than the first pads 15, the functional elements 12 and the first pads 15 can be arranged to stack on each other, thereby increasing the area of the first pads 15.

To provide connections between the first pads 15 and the second pads 16, the first pads 15 or the second pads 16 may be made of a low-melting-point material, such as solder, indium, lead, or the like. In this manner, the first pads 15 and can be welded to the second pads 16 by applying a suitably high temperature corresponding to the melting temperature of each low-melting-point material for a predetermined period of time after the transfer of the separated element chip 13 onto the second substrate 14, thereby making connections therebetween. Alternatively, a liquid metal application process using inkjet may be employed to form connections between the first pads 15 and the second pads 16. Alternatively, a wire bonding method, an anisotropic conductive material, or an anisotropic conductive film may be used.

Although not shown in the drawings, each first pad 15 may protrude from an end face of the element chip 13 outwardly parallel to the plane of the first substrate 11, and a shape corresponding to the first pad 15 may be formed in the second substrate 14. In such a case, the first substrate 14 is also arranged to have a protruding portion at the part corresponding to the protruding first pad 15 so as to support and reinforce the protruding first pad 15. The second pad 16 having the shape corresponding to the shape of the first pad 15 is preferably positioned outside the region where the element chip 13 is disposed, and the first pad 15 is preferably inserted in the second pad 16. According to this structure, the first pad 15 and the second pad 16 can be self-aligned, and the connection between the first pad 15 and the second pad 16 are ensured even when misalignment occurs.

Figure 4:
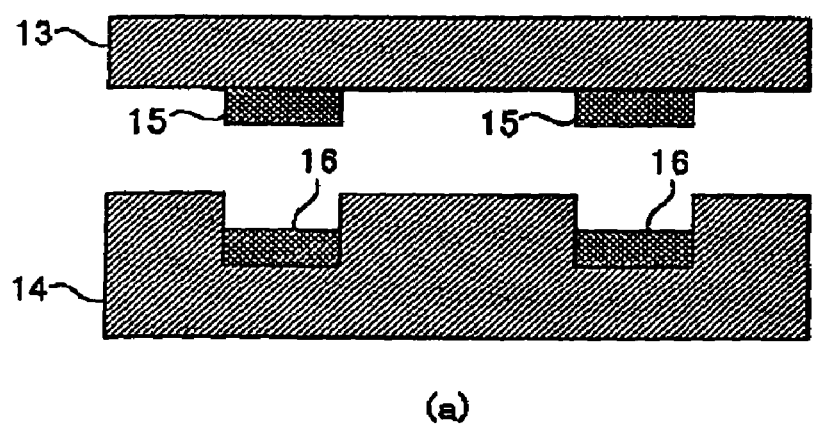
FIGS. 4(*a*) and 4(*b*) are cross-sectional views schematically showing an example in which first pads are given a convex shape and second pads are given concave shape.
Figure 4:
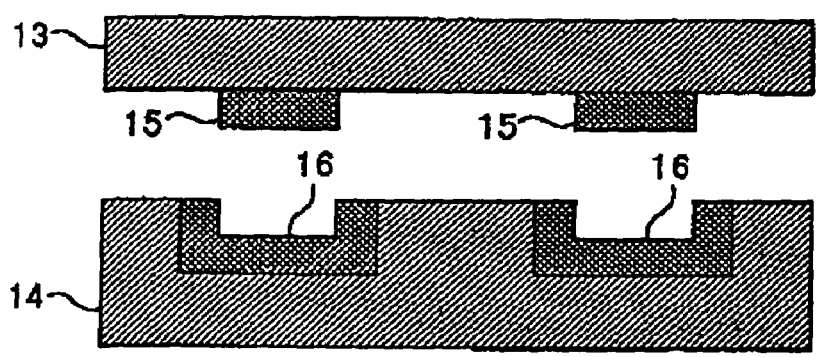

The first pad 15 may be formed to have a convex shape, and the second pad 16 may be formed to have a concave shape. Alternatively, the first pad 15 may be formed to have a concave shape, and the second pad 16 may be formed to have a convex shape. Such a structure is schematically shown in a cross-sectional view of FIGS. 4(a) and 4(b). The functional elements 12, the interconnections 17, and the like are omitted. As shown in FIGS. 4(a) and 4(b), when the first pad 15 has a convex shape, a concavity corresponding to the convex shape is formed in the second substrate 14. Each second pad 16 is formed so that the conductive material either partially covers the concavity (shown in FIG. 4(a)) or completely covers the concavity (shown in FIG. 4(b)). According to this structure, the first pads 15 and the second pads 16 can be self-aligned, and the connections between the first pads 15 and the second pads 16 can be ensured even when misalignment occurs.

An insulating layer of the element chip 13 may be composed of a low-dielectric-constant material. According to this structure, the parasitic capacitance in and around the functional elements 12 of the element chip 13 can be reduced, and a decrease in power consumption and an increase in operating frequency can be expected. Alternatively, the insulating layer of the element chip 13 may be air, liquid, or vacuum. Also, according to this structure, the parasitic capacitance in and around the functional elements 12 of the element chip 13 can be reduced, and a decrease in power consumption and an increase in operating frequency can be expected.

The first substrate 11, the functional element 12, the element chip 13, the second substrate 14, the first pads 15, the second pads 16, and the interconnections 17 may be of any material and of any structure. Manufacturing these and other elements from the above and other materials and other structures is still within the spirit of the present invention.

Second Exemplary Embodiment

Figure 5:
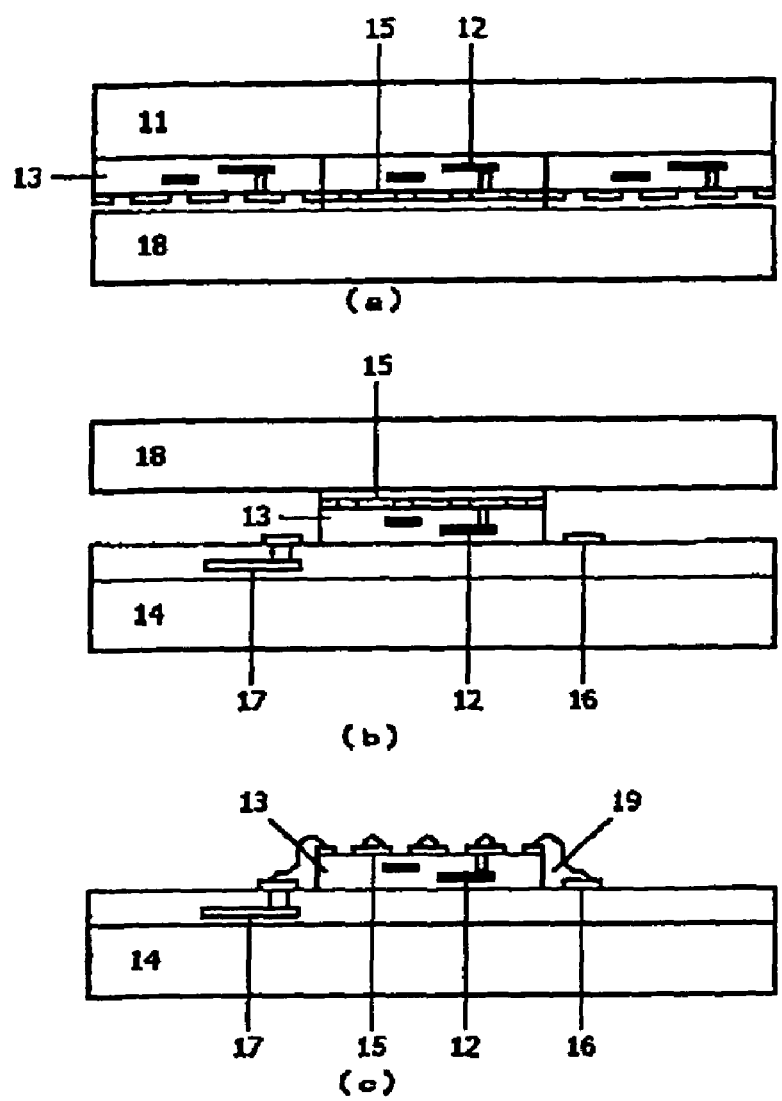
FIGS. 5(*a*)-5(*c*) are schematics that show a manufacturing method according to a second exemplary embodiment of the present invention.

FIGS. 5(a)-5(c) show steps of a manufacturing method according to a second exemplary embodiment of the present invention. A semiconductor device is manufactured by forming functional elements 12 on a first substrate 11, separating an element chip 13 including at least one functional element 12, transferring the element chip 13 onto a third substrate 18, transferring the element chip 13 onto a second substrate 14, and connecting first pads 15 composed of a conductive material and disposed on the element chip 13 to second pads 16 composed of a conductive material and disposed on the second substrate 14. FIG. 5(a) is a schematic showing the step of bonding an element-chip-forming face of the first substrate 11 and the third substrate 18. FIG. 5(b) is a schematic showing the step of separating the element chip 13, transferring the element chip 13 onto the third substrate 18, and bonding the face of the third substrate 18 provided with the element chip onto the second substrate 14. FIG. 5(c)

is a schematic showing the step of transferring the element chip 13 onto the second substrate 14 and removing the third substrate 18. As indicated by reference numeral 19, the connections between the first pads 15 and the second pads 16 are formed after the separating and transferring from the third substrate to the second substrate.

Figure 6:
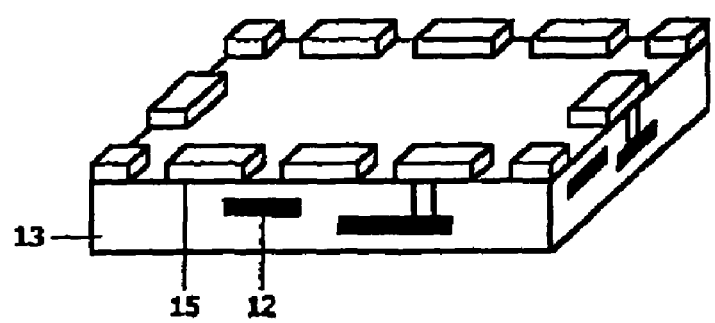
FIG. 6 is a schematic perspective view that shows the structure of an element chip according to the second exemplary embodiment of the present invention.

FIG. 6 is a schematic showing the structure of the element chip according to the second embodiment of the present invention. The functional elements 12 are electrically connected to the predetermined first pads 15. Only the first pads 15 are formed at the surface of the element chip 13 remote from the second substrate 14. No other elements or electrode are formed at the surface of the element chip 13 remote from the second substrate 14. According to this structure, the area of the first pads 15 can be increased. Moreover, the functional elements 12 are closer to the second substrate 14 than the first pads 15. According to this structure, the functional elements 12 and the first pads 15 are formed by stacking so that the first pads 15 and the functional elements 12 overlap each other, thereby increasing the area of the first pads 15.

Figure 7:
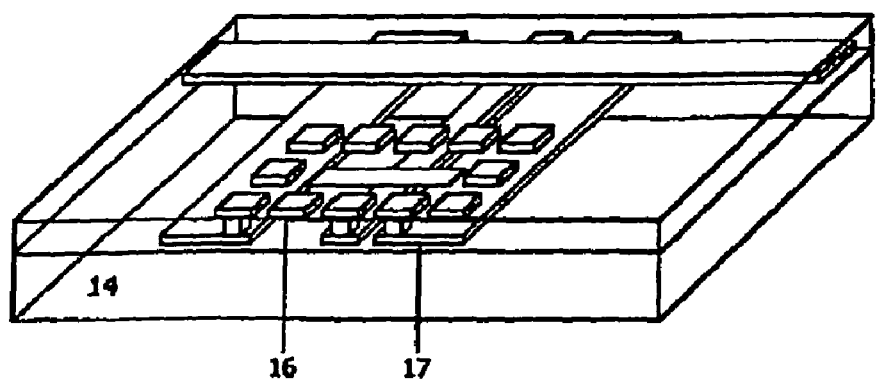
FIG. 7 is a schematic perspective view that shows the structure of a second substrate according to the second exemplary embodiment of the present invention.

FIG. 7 is a schematic showing the structure of the second substrate according to the second exemplary embodiment of the present invention. The schematic is a perspective view, and interconnections, contact holes, via plugs, and the like are partially omitted from FIG. 7. Not only the second pads 16 but also interconnections 17 for connection with the predetermined second pads 16 are formed on the second substrate 14. The second pads 16 are also provided around the positions on the second substrate 14 corresponding to the first pads 15 on the element chip 13.

It is effective to form on the first pads 15 on the face of the element chip 13 remote from the second substrate 14 in order to increase the area of the first pads 15 even in a semiconductor element manufactured by forming the functional elements 12 on the first substrate 11, separating the element chip 13 including at least one functional element 12, transferring the element chip 13 on the second substrate 14, and connecting the first pads 15 composed of a conductive material and disposed on the element chip 13 to the second pads 16 composed of a conductive material and disposed on the second substrate 14. At this time, the functional elements 12 are closer to the second substrate 14 then the first pads 15. In this manner, the functional elements 12 and the first pads 15 can be formed by stacking, and the functional elements 12 and the first pads 15 overlap each other, thereby increasing the area of the first pads 15.

In order to connect the first pads 15 to the second pads 16, connecting leads 19 shown in FIG. 5(c) may be made by a liquid metal application process using inkjet. Alternatively, a wire-bonding process may be employed.

Each first pad 15 may protrude from an end face of the element chip 13 outwardly parallel to the plane of the first substrate 11, and a shape corresponding to the first pad 15 may be formed in the second substrate 14. In such a case, the first substrate 14 is also arranged to have a protruding portion at the part corresponding to the protruding first pad 15 so as to support and reinforce the protruding first pad 15. The second pad 16 having the shape corresponding to the shape of the first pad 15 is preferably positioned outside the region where the element chip 13 is disposed, and the first pad 15 is preferably inserted in the second pad 16. According to this structure, the first pad 15 and the second pad 16 can be self-aligned, and the connection between the first pad 15 and the second pad 16 are ensured even when misalignment occurs. An insulating layer of the element chip 13 may be composed of a low-dielectric-constant material. According to this structure, the parasitic capacitance in and around the functional elements 12 of the element chip 13 can be reduced, and a decrease in power consumption and an increase in operating frequency can be expected. Alternatively, the insulating layer of the element chip 13 may be air, liquid, or vacuum. According to this structure also, the parasitic capacitance in and around the functional elements 12 of the element chip 13 can be reduced, and a decrease in power consumption and an increase in operating frequency can be expected.

The first substrate 11, the functional element 12, the element chip 13, the second substrate 14, the first pads 15, the second pads 16, the interconnections 17, the third substrate 18, and the connecting leads 19 may be of any material and of any structure. Manufacturing these and other elements from the above and other materials and in other structures is still within the spirit of the present invention.

Third Exemplary Embodiment

Figure 8:
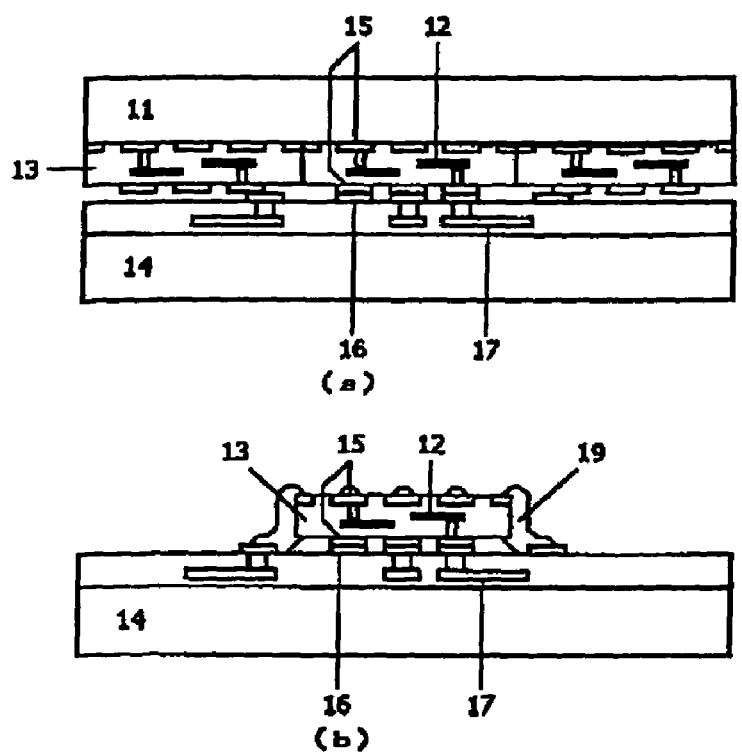
FIGS. 8(*a*) and 8(*b*) are schematics that show a manufacturing method according to a third exemplary embodiment of the present invention.

FIGS. 8(a) and 8(b) are schematics showing steps of a manufacturing method according to a third exemplary embodiment of the present invention. A semiconductor device is manufactured by forming functional elements 12 on a first substrate 11, separating an element chip 13 including at least one functional element 12, transferring the element chip 13 onto a second substrate 14, and connecting first pads 15 composed of a conductive material and disposed on the element chip 13 to second pads 16 composed of a conductive material and disposed on the second substrate 14. FIG. 8(a) is a schematic showing the step of bonding the element-chip-forming face of the first substrate 11 onto the second substrate 14. FIG. 8(b) is a schematic showing the step of separating the element chip 13, transferring the element chip 13 onto the second substrate 14, and removing the first substrate 11. The connections between the first pads 15 and the second pads 16 may be made either before or after the separating and transferring. The connections between the first pads 15 disposed remote from the second substrate 14 and the second pads 16 are formed after the separating and transferring from the first substrate to the second substrate.

Figure 9:
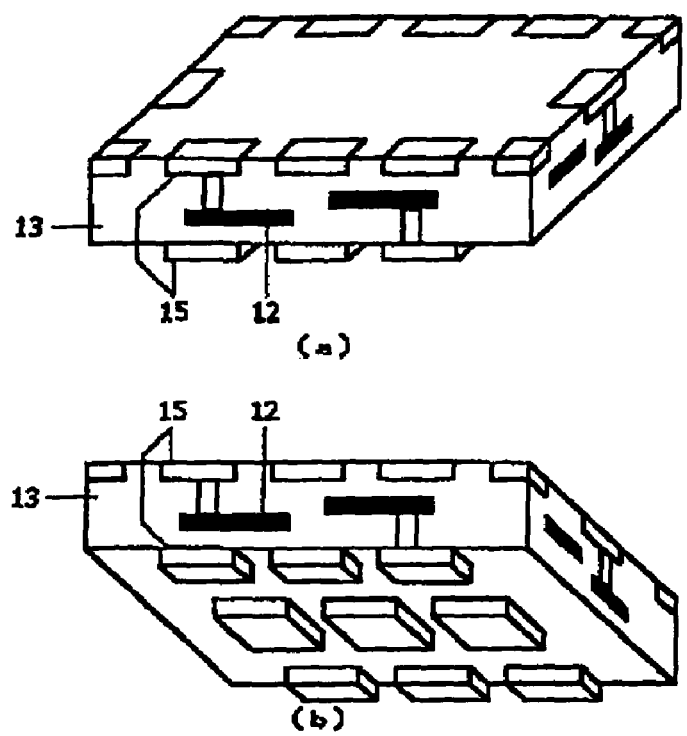
FIGS. 9(*a*) and 9(*b*) are schematic perspective views that show the structure of an element chip according to the third exemplary embodiment of the present invention.

FIGS. 9(a) and 9(b) are schematics showing the structure of the element chip according to the third exemplary embodiment of the present invention. FIG. 9(a) is a bird's-eye view viewed from the side remote from the second substrate 14, and FIG. 9(b) is a bird's-eye view viewed from the second-substrate-14-side. The functional elements 12 are electrically connected to the predetermined first pads 15. The first pads 15 are formed on the second-element-14-side surface of the element chip 13 and the surface of the element chip 13 remote from the second substrate 14. According to this structure, the area of the first pads 15 can be further increased.

Figure 10:
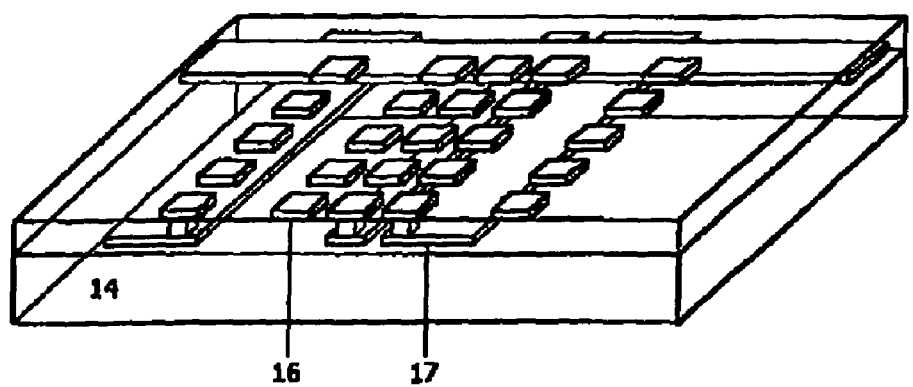
FIG. 10 is a schematic perspective view that shows the structure of a second substrate according to the third exemplary embodiment of the present invention.

FIG. 10 is a schematic showing the structure of the second substrate according to the third exemplary embodiment of the present invention. The schematic is a perspective view, and connections, contact holes, via plugs and the like are partially omitted. Not only the second pads 16 but also the interconnections 17 for connection with the predetermined second pads are formed on the second substrate 14. The second pads 16 are formed on the second substrate 14 at and around positions corresponding to the positions of the first pads 15.

It is effective to form the first pads on the second-element-14-side surface of the element chip 13 and the surface of the element chip 13 remote from the second substrate 14 in order to further increase the area of the first pads 15 even in a semiconductor element manufactured by forming the functional elements 12 on the first substrate 11, separating the element chip 13 including at least one functional element 12, transferring the element chip on the third substrate 18, transferring the element chip 13 on the second substrate 14, and connecting the first pads 15 composed of a conductive material and disposed on the element chip 13 to the second pads 16 composed of a conductive material and disposed on the second substrate 14.

To provide connections between the first pads 15 at the second-substrate-2-side and the second pads 16, the first pads 15 and the second pads 16 may be made of a low-melting-point material, such as solder, indium, lead, or the like. In this manner, the first pads 15 and can be welded to the second pads 16 by applying a suitably high temperature corresponding to the melting temperature of each low-melting-point material for a predetermined period of time after the transfer of the separated element chip 13 onto the second substrate 14, thereby making connections therebetween. Alternatively, a liquid metal application process using inkjet may be employed. Alternatively, a wire bonding method, an anisotropic conductive material, or an anisotropic conductive film may be used.

In order to connect the first pads 15 remote from the second substrate 14 to the second pads 16, connecting leads 19 shown in FIG. 8(b) may be formed by a liquid metal application process using inkjet. Alternatively, a wire-bonding process may be employed.

Each first pad 15 may protrude from an end face of the element chip 13 outwardly parallel to the plane of the first substrate 11, and a shape corresponding to the first pad 15 may be formed in the second substrate 14. In such a case, the first substrate 14 is also arranged to have protruding portion at the part corresponding to the protruding first pad 15 so as to support and reinforce the protruding first pad 15. The second pad 16 having the shape corresponding to the shape of the first pad 15 is preferably positioned outside the region where the element chip 13 is disposed, and the first pad 15 is preferably inserted in the second pad 16. According to this structure, the first pad 15 and the second pad 16 can be self-aligned, and the connection between the first pad 15 and the second pad 16 are ensured even when misalignment occurs.

The first pad 15 may be formed to have a convex shape, and the second pad 16 may be formed to have a concave shape. Alternatively, the first pad 15 may be formed to have a concave shape, and the second pad 16 may be formed to have a convex shape. For example, when the first pads 15 are formed to have a convex shape, concavities corresponding to the convex shape are formed in the second substrate 14. Each second pad 16 is formed so that the conductive material either partially covers the concavity (refer to FIG. 4(a)) or completely covers the concavity (refer to FIG. 4(b)). According to this structure, the first pads 15 and the second pads 16 can be self-aligned, and the connections between the first pads 15 and the second pads 16 can be ensured even when misalignment occurs.

An insulating layer of the element chip 13 may be composed of a low-dielectric-constant material. According to this structure, the parasitic capacitance in and around the functional elements 12 of the element chip 13 can be reduced, and a decrease in power consumption and an increase in operating frequency can be expected. Alternatively, the insulating layer of the element chip 13 may be air, liquid, or vacuum. Also, according to this structure, the parasitic capacitance in and around the functional elements 12 of the element chip 13 can be reduced, and a decrease in power consumption and an increase in operating frequency can be expected.

The first substrate 11, the functional element 12, the element chip 13, the second substrate 14, the first pads 15, the second pads 16, the interconnections 17, and the connecting leads 19 may be of any material and of any structure. Manufacturing these and other elements from the above and other materials and other structures is still within the spirit of the present invention.

Fourth Exemplary Embodiment

Figure 11:
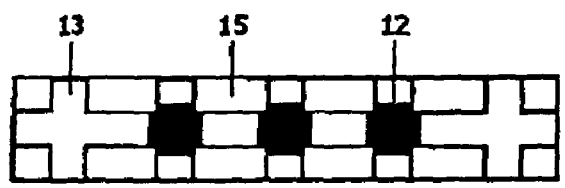
FIG. 11 is a schematic that shows the structure of an element chip according to a fourth exemplary embodiment of the present invention.

FIG. 11 is a schematic showing the structure of an element chip according to a fourth exemplary embodiment of the present invention. The overall manufacturing method and the structure of the second substrate are the same as those of the first to third exemplary embodiments. The peripheral length L and the area S of the element chip 13 satisfies the relationship:

$$L>2\pi^{1/2}S^{1/2}$$

Moreover, the following relationship is satisfied: $L>4S^{1/2}$. In particular, L=36, and S=45. According to this arrangement, wide first pads 15 can be formed by increasing the peripheral length of the element chip 13. Since the area of the element chip 13 does not increase, the same advantage of decreasing the manufacturing cost can still be achieved. Although the element chip 13 of this exemplary embodiment has an oblong shape, any other shape, such as a letter-L shape, a letter-U shape, a ring shape, an arc shape, or the like may be employed as long as the two relationships described above are satisfied. Manufacturing these elements into other shapes is still within the spirit of the present invention.

Exemplary Method of Separating and Transferring

Figure 12:
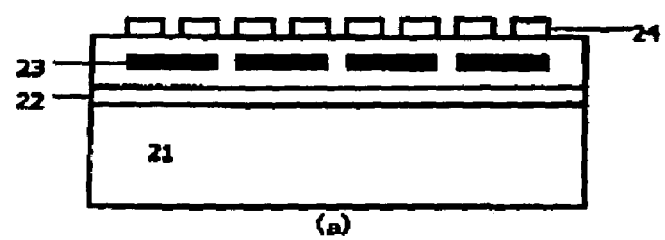
FIGS. 12(*a*)-12(*c*) are schematics that show an exemplary separating and transferring method according to the present invention.
Figure 12:
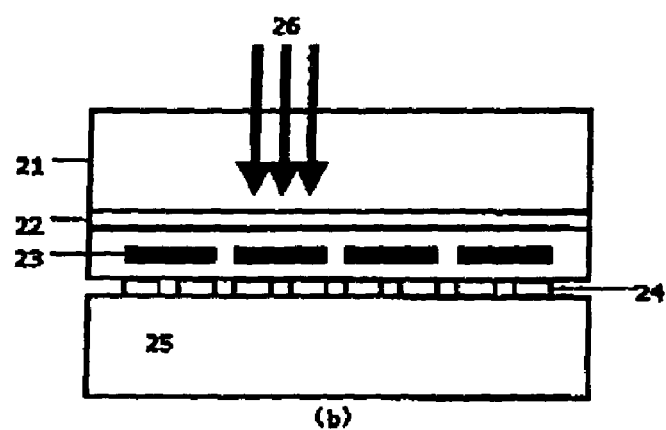
Figure 12:
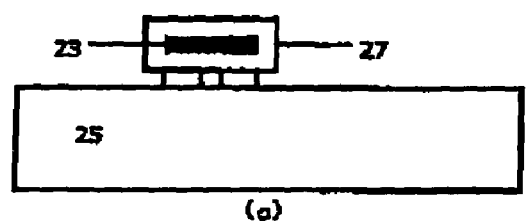

FIGS. 12(a)-12(c) are schematics showing an exemplary method of separating and transferring according to the present invention. The description below is an example of separating and transferring according to the present invention (Japanese Patent Application Nos. 2001-282423 and 2001-282424; T. Shimoda, et al., Techn. Dig. IEDM 1999, 289; S. Utsunomiya, et al., Dig. Tech. Pap. SID 2000, 916; T. Shimoda, Proc. Asia Display/IDW '01, 327; and S. Utsunomiya, et al., Proc. Asia Display/IDW '01, 339). First, an amorphous silicon film 22 is formed on a first substrate 21, composed of quartz or glass, by plasma-enhanced chemical vapor deposition (PECVD) using $SiH_4$ or by low-pressure chemical vapor deposition (LPCVD) using $Si_2H_6$. Functional elements 23 are formed on the amorphous silicon film 22. First pads 24 are formed as the topmost layer (FIG. 12(a)). This structure is flipped upside-down and bonded onto a second substrate 25. Only an element chip 27, which is the element chip targeted for separation and transfer, is irradiated with laser 26 through the first substrate 21, which is composed of quartz or glass and is thus transparent (FIG. 12(b)). Only the portion of the amorphous silicon film 22 irradiated with the laser 26 separated by ablation, and the an element chip 27 is transferred onto the second substrate 25 (FIG. 12(c)). The separation and transfer of the element chip 27 is performed by irradiation of the laser 26. In this manner, the separation and transfer of the element chip 27 can be reliably performed.

Exemplary Method of Making Thin-film Transistors

Figure 13:
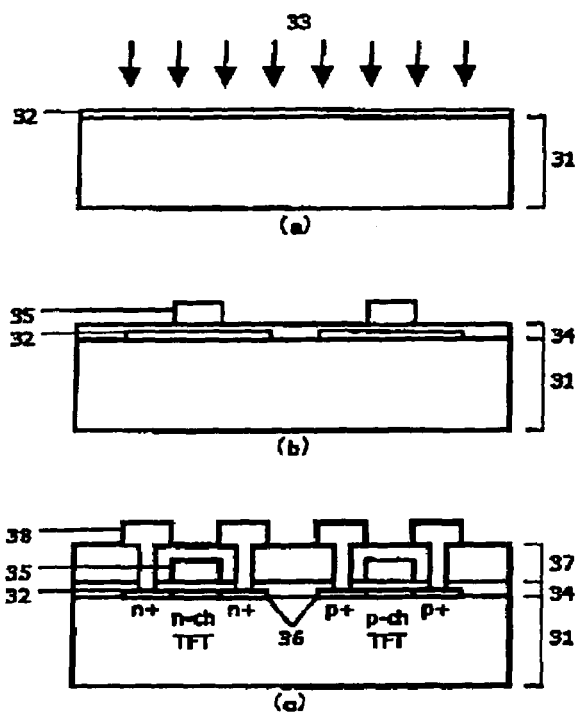
FIGS. 13(*a*)-13(*c*) are schematics that show an exemplary method of making a thin-film transistor according to the present invention.

FIGS. 13(a)-13(c) are schematics showing a method of manufacturing a thin-film transistor according to the present invention. A thin-film transistor is an exemplary of a functional element of the present invention, and the method of making the thin-film transistor is described. A laser-crystallized polycrystalline thin-film transistor is described below as an example. First, an amorphous silicon film is formed on a first substrate 31 composed of quartz or glass by PECVD using $SiH_4$ or by LPCVD using $Si_2H_6$. Irradiation with laser 33 crystallizes the amorphous silicon film, thereby producing a polycrystalline silicon film 32 (FIG. 13(a)). After patterning the polycrystalline silicon film 32, a gate insulating film 34 is deposited, and gate electrodes 35 are formed and patterned (FIG. 13(b)). An impurity such as phosphorus, boron, or the like is implanted into the polycrystalline silicon film 32 in a self-aligning manner using the gate electrodes 35, and is activated to make source/drain regions 36 of a CMOS structure. An interlayer insulating film 37 is then deposited, contact holes are formed, and source/drain electrodes 38 are formed and patterned (FIG. 13(c)). This functional element is a thin-film transistor. In this manner, a high-performance thin-film transistor, which has conventionally required an advanced, complicated manufacturing process, can include larger or wider first pads.

Exemplary Method of Making Organic Electroluminescent Elements

Figure 14:
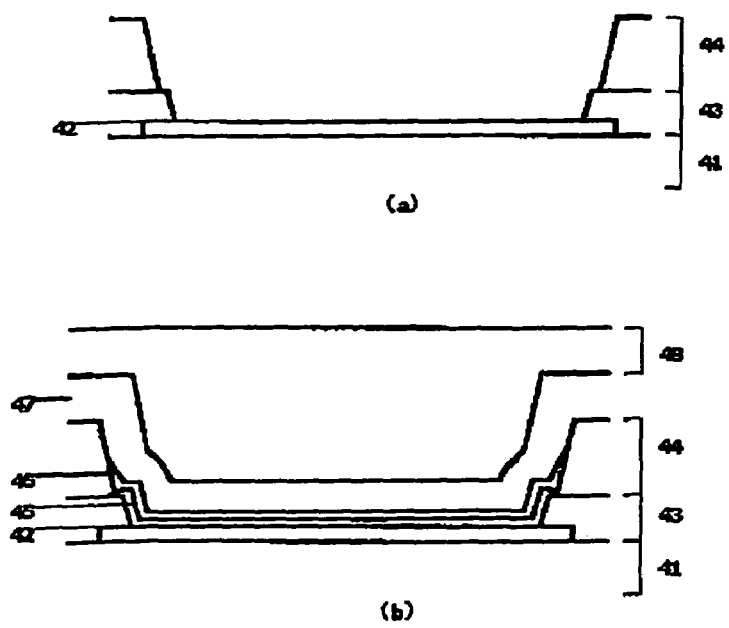
FIGS. 14(*a*) and 14(*b*) are graphs that show an exemplary method of making an organic electroluminescent element.

FIGS. 14(a) and 14(b) are schematics showing a method of making an organic electroluminescent element according to the present invention. An organic electroluminescent element is an example of the functional element, and the manufacturing thereof is explained. A transparent electrode 42 is first deposited on a first substrate 41 composed of quartz or glass. A contact layer 43 is deposited, and an opening is formed in a region designed to emit light. A bank 44 is deposited using polyimides or acryls, and an opening is formed in the region designed to emit light (FIG. 14(a)). Next, the wettability of the substrate surface is adjusted by plasma processing using an oxygen plasma, a $CF_4$ plasma, or the like. A hole injection layer 45 and a luminescent layer 46 are formed by a liquid-phase process, such as spin-coating, squeegee application, or an inkjet process (T. Shimoda, S. Seki, et al., Dig. SID '99, 376; and S. Kanbe, et al., Proc. Euro Display '99 Late-News Papers, 85), or by a vacuum-process such as sputtering or vapor deposition. In order to reduce the work function, a cathode 47 including an alkali metal is deposited, and sealing is provided by a sealant 48 to complete the process (FIG. 14(b)). This functional element is an organic electroluminescent element. In this manner, a high-performance organic electroluminescent element, which has conventionally required an advanced, complicated manufacturing process, can include larger or wider first pads.

Fifth Exemplary Embodiment

Figure 15:
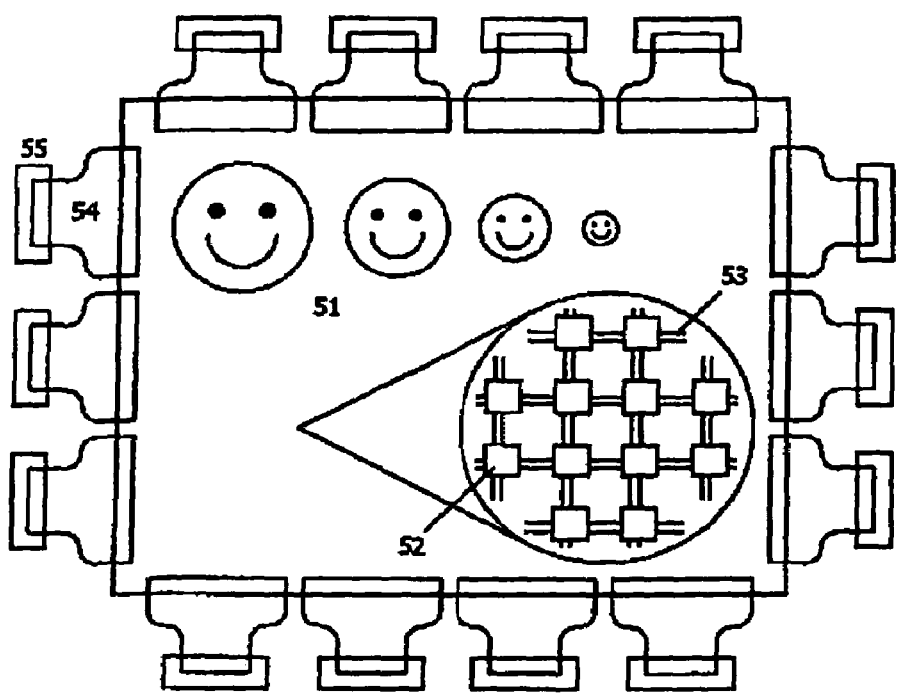
FIG. 15 is a schematic that shows an electrooptic apparatus according to a fifth exemplary embodiment of the present invention.

FIG. 15 is a schematic showing an electrooptic apparatus according to a fifth exemplary embodiment of the present invention. Element chips 52 are arranged and interconnections 53 are formed on a display region 51. The interconnections 53 are connected to driving circuits 55 via extraction lines 54. This electrooptic apparatus uses the semiconductor devices. Since ratio of the area of the interconnections and supporting members relative to that of the functional element is generally large in an electrooptic apparatus, the effect of cost reduction resulting from preparing the interconnections and supporting members separately and arranging functional element only at the required positions is large.

Figure 16:
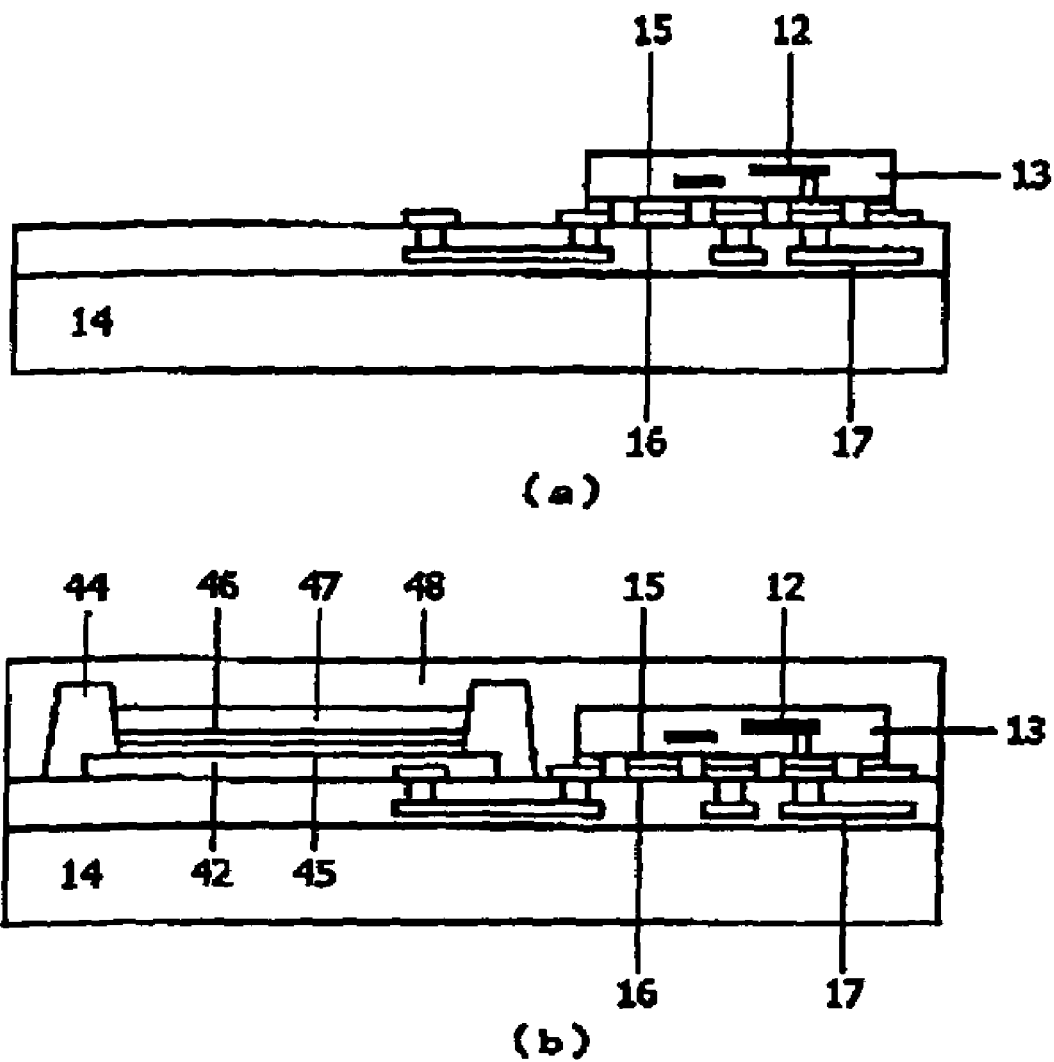
FIGS. 16(*a*) and 16(*b*) are schematics that show a manufacturing method according to the fifth exemplary embodiment of the present invention.

FIGS. 16(a) and 16(b) are schematics showing a manufacturing method according to the fifth exemplary embodiment of the present invention. First, a semiconductor device is formed in the same manner as that of the first exemplary embodiment (FIG. 16(a)). Subsequently, the organic electroluminescent element is made (FIG. 16(b)).

The driving circuits 55 may be formed on the same substrate as that including the display region by a technique, such as the above-described separation and transfer, or a technique described above of making a thin-film transistor. Although an organic electroluminescent display apparatus is illustrated in this exemplary embodiment, the electrooptic apparatus may be of other type, such as liquid crystal display apparatus or an electrophoresis display device.

Figure 17:
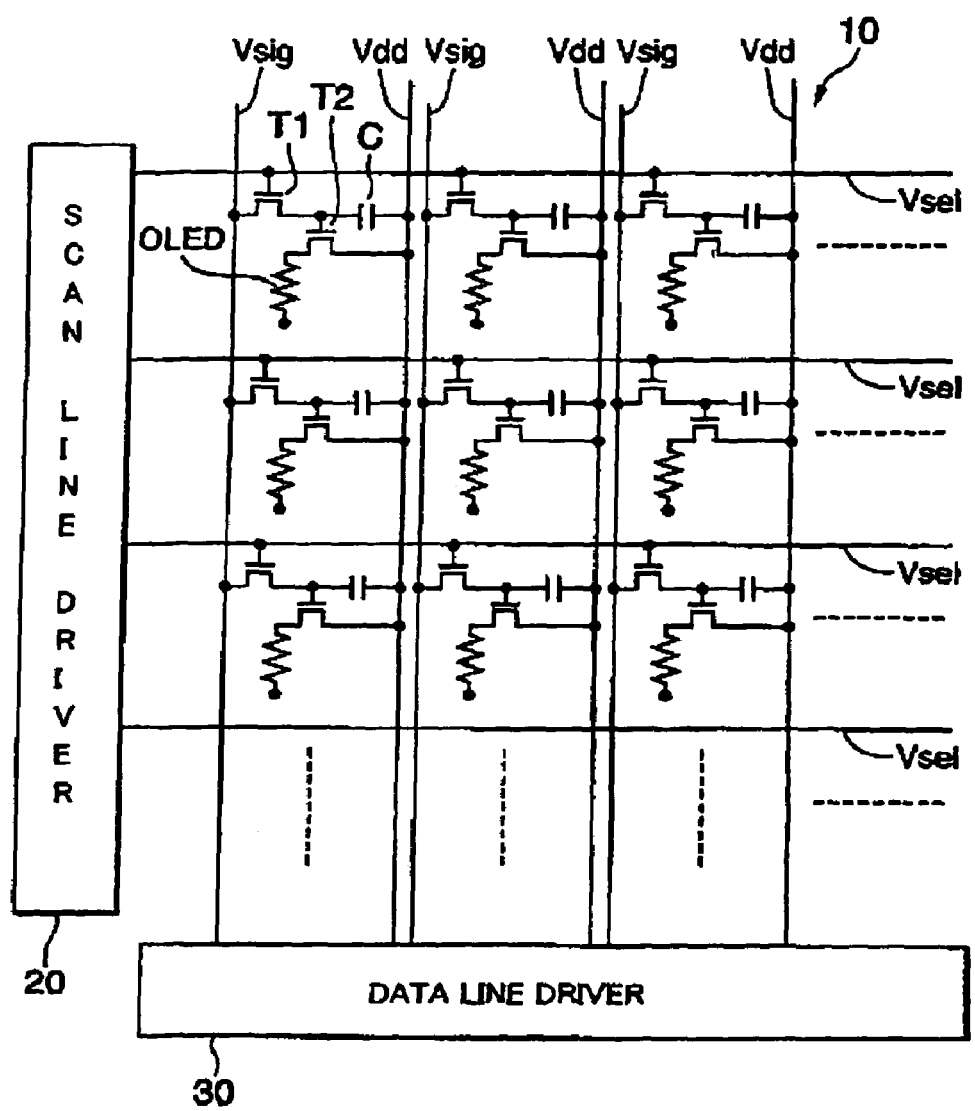
FIG. 17 is a schematic circuit configuration of a pixel region of an electrooptic apparatus using semiconductor devices of the present invention.

FIG. 17 is a schematic circuit configuration of a pixel region of an active-matrix electrooptic apparatus 10. Each pixel includes a luminescent layer OLED that can emit light by an electroluminescent effect, a hold capacitor C to store electric current for driving the luminescent layer OLED, and thin-film transistors T1 and T2. Selection signal lines Vsel extend from a scanline driver 20 to each of the pixels. Signal lines Vsig and power lines Vdd extend from a data line driver 30 to each of the pixels. By controlling the selection signal lines Vsel and the signal lines Vsig, the electric current to each of the pixels is programmed, and light emission from the luminescent layers OLED is controlled.

Example of Electronic Apparatus

Figure 18:
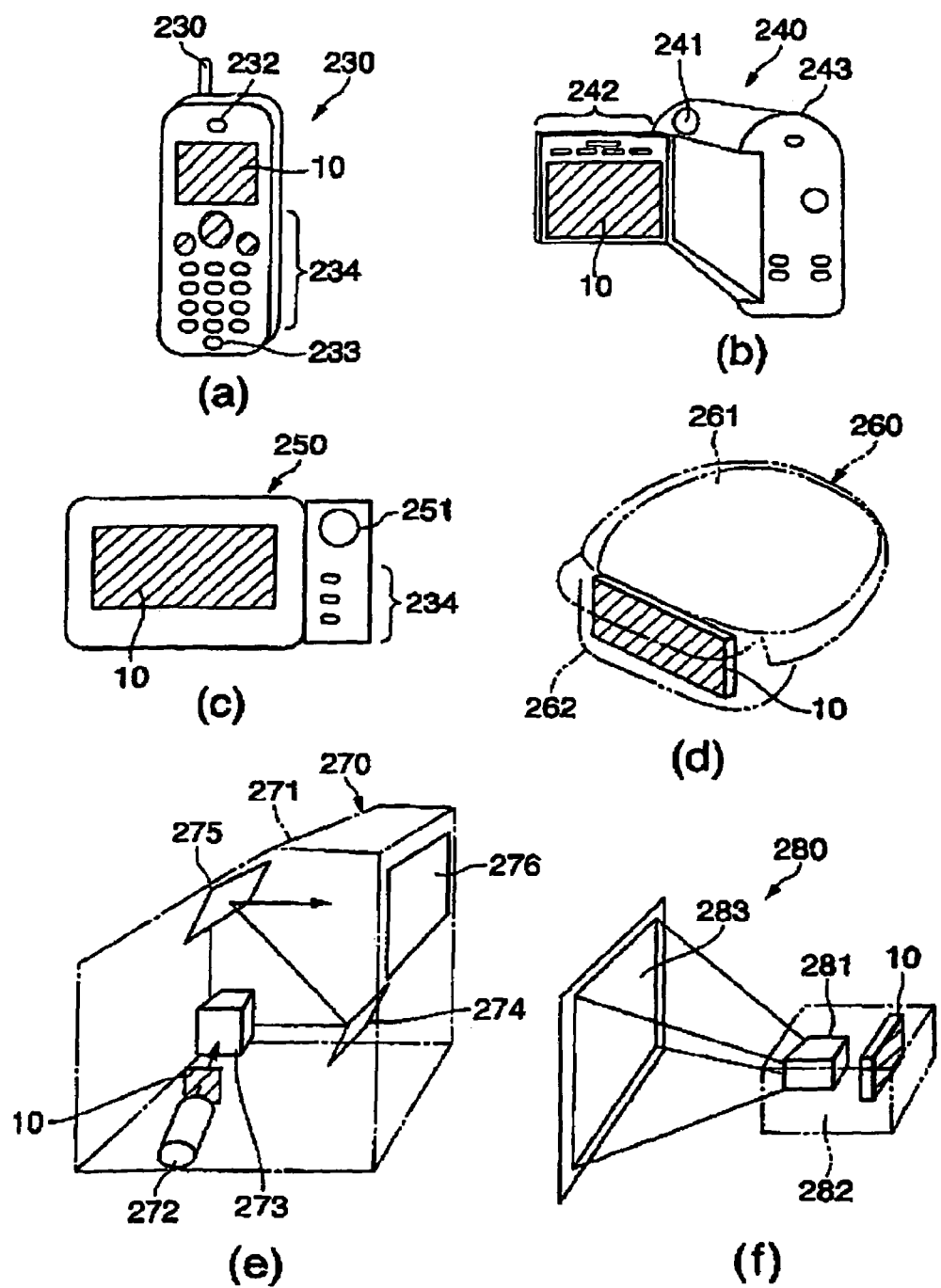
FIGS. 18(*a*)-18(*f*) are schematics that show examples of electronic apparatuses to which the semiconductor devices of the present invention are incorporated.

Examples of electronic apparatuses to which the semiconductor devices described above are incorporated are depicted in FIGS. 18(a)-18(f). FIG. 18(a) illustrates an application to a cellular phone. A cellular phone 230 includes an antenna unit 231, an audio output unit 232, an audio input unit 233, an operation unit 234, and the electrooptic apparatus 10 including semiconductor devices of the present invention. The semiconductor devices of the present invention can be used in the display section of the cellular phone 230. FIG. 18(b) illustrates an application to a video camera. A video camera 240 includes an image reception unit 241, an operation unit 242, an audio input unit 243, and the electrooptic apparatus 10 including semiconductor devices of the present invention. The semiconductor devices of the present invention can be used in a finder or in a display section. FIG. 18(c) illustrates an application to a portable personal computer. A computer 250 includes a camera unit 251, an operation unit 252, and the electrooptic apparatus 10 includes the semiconductor devices of the present invention. The semiconductor devices of the present invention can be used in a display section.

FIG. 18(d) illustrates an application to a head-mounted display. A head-mounted display 260 includes a band 261, an optical-system compartment 262, and the electrooptic apparatus 10 including the semiconductor devices of the present invention. Accordingly, the semiconductor devices of the present invention can be used as the image display source. FIG. 18(e) illustrates an application to a rear projector. A projector 270 includes a housing 271, a light source 272, a composite optical system 273, a mirror 274, a mirror 275, a screen 276, and the electrooptic apparatus 10 including semiconductor devices of the present invention. Accordingly, the semiconductor devices of the present invention can be used as the image display source. FIG. 18(f) illustrates an application to a front projector. A projector 280 has a housing 282 that includes an optical system 281 and the electrooptic apparatus 10 including the semiconductor devices of the present invention. Images are displayed in a screen 283. Accordingly, the semiconductor devices of the present invention can be used as the image display source.

The semiconductor devices of the present invention can be applied to any electronic apparatuses using active matrix electrooptic apparatuses other than those described above. For example, they can be applied to fax machine with a display function, a finder of a digital camera, a portable television set, a DSP device, a PDA, an electronic databook, an electric bulletin board, an advertisement display, or the like.

Advantages

According to the present invention, in a semiconductor device manufactured by forming functional elements on a first substrate, separating an element chip including at least one functional element, transferring the element chip to a second substrate, and connecting first pads composed of a conductive material and disposed on the element chip to second pads composed of a conductive material and disposed on the second substrate, or in a semiconductor device manufactured by forming functional elements on a first substrate, separating an element chip comprising at least one functional element, transferring the element chip to a third substrate, transferring the element chip to a second substrate, and connecting first pads composed of a conductive material and disposed on the element chip to second pads composed of a conductive material and disposed on the second substrate, the area and the width of each first pad can be increased.

What is claimed is:

1. A method of manufacturing a semiconductor device, the method comprising:
   forming a first member including a first base material and an element chip on which a plurality of first pads are formed;
   forming a second member including a wire and a second base material;
   forming a third member including the element chip and the wire, and the forming of the third member including peeling the element chip from the first member; and
   forming a fourth member including the first member and the second member prior to the forming of the third member,
   the peeling the element chip from the first base material being carried out after the forming of the fourth member, and disposing an electro-optical layer sandwiched between a first electrode and a second electrode, the first electrode being coupled to at least one element chip through at least one of the pluralities of the first pads.

2. The method according to claim 1, in the forming of the third member, the plurality of first pads contacting the second member.

3. The method according to claim 1, in the forming of the third member, the first pads being disposed between the element chip and the first member.

4. The method according to claim 1, in the forming of the third member, at least one of the plurality of first pads contacting the second member and at least one of the first pads being disposed between the element chip and the first member.

5. The method according to claim 1, the peeling the element chip from the first member using energy irradiation.

6. The method according to claim 1, in the forming of the second member, forming a plurality of second pads that are coupled to the wire on the second base material.

7. A method of manufacturing an electro-optical device, the method comprising:
   preparing the semiconductor device according to claim 1; and
   forming an electro-optical element driven by the semiconductor device.

8. A method of manufacturing a semiconductor device, the method comprising:
   forming a first member including a first base material and a plurality of element chips on each of which a plurality of first pads are disposed;
   forming a second member including a wire and a second base material; and
   forming a third member including at least one of the plurality of first pads and the wire, the forming of the third member including peeling at least one of the plurality of element chips from the first member, and disposing an electro-optical layer sandwiched between a first electrode and a second electrode, the first electrode being coupled to the at least one element chip through at least one of the plurality of first pads.

9. A method of manufacturing electro-optical device, the method comprising:
   forming a first member including a first base material and an element chip on which a plurality of first pads are formed;
   forming a second member including a wire and a second base material; and
   forming a third member including the element chip, the wire and an electro-optical element, the forming of the third member including peeling the element chip from the first member, and disposing an electro-optical layer sandwiched between a first electrode and a second electrode, the first electrode being coupled to the at least one element chip through at least one of the plurality of first pads.

10. The method according to claim 9, in the forming of the third member, the plurality of first pads contacting the second member.

11. The method according to claim 9, in the forming of the third member, the first pads being disposed between the element chip and the first member.

12. The method according to claim 9, in the forming of the third member, at least one of the plurality of first pads contacting the second member and at least one of the first pads being disposed between the element chip and the first member.

13. The method according to claim 9, the peeling of the element chip from the first member uses a method of energy irradiation.

14. The method according to claim 9, in the peeling, the first base material from the first member, the first member including a plurality of element chips, and
   peeling at least one of the plurality of element chips from the first member.

15. The method according to claim 9, further comprising forming a fourth member including the first member and the second member prior to the forming of the third member.

16. The method according to claim 15, the peeling of the element chip from the first base material being carried out after the forming of the fourth member.

* * * * *